US012311646B2

(12) United States Patent
Liang et al.

(10) Patent No.: US 12,311,646 B2
(45) Date of Patent: May 27, 2025

(54) PREPARATION METHOD FOR COPPER CLAD LAMINATE HAVING LOW DIELECTRIC CONSTANT AND HIGH PEEL STRENGTH, COPPER CLAD LAMINATE AND APPLICATION THEREOF

(71) Applicant: JIANGMEN DEZHONGTAI ENGINEERING PLASTICS TECHNOLOGY CO., LTD., Jiangmen (CN)

(72) Inventors: Yonghua Liang, Jiangmen (CN); Liangwen Jin, Jiangmen (CN); Hongzhuan Zheng, Jiangmen (CN)

(73) Assignee: JIANGMEN DEZHONGTAI ENGINEERING PLASTICS TECHNOLOGY CO., LTD. (CN)

( * ) Notice: Subject to any disclaimer, the term of this patent is extended or adjusted under 35 U.S.C. 154(b) by 473 days.

(21) Appl. No.: 17/781,599

(22) PCT Filed: Jun. 4, 2020

(86) PCT No.: PCT/CN2020/094436
§ 371 (c)(1),
(2) Date: Jun. 1, 2022

(87) PCT Pub. No.: WO2021/120534
PCT Pub. Date: Jun. 24, 2021

(65) Prior Publication Data
US 2022/0402255 A1   Dec. 22, 2022

(30) Foreign Application Priority Data
Dec. 20, 2019 (CN) .......................... 201911322264.8

(51) Int. Cl.
| H05K 3/02 | (2006.01) |
| B32B 5/02 | (2006.01) |
| B32B 15/14 | (2006.01) |
| B32B 15/20 | (2006.01) |
| B32B 37/00 | (2006.01) |
| H05K 1/03 | (2006.01) |
| B32B 38/08 | (2006.01) |

(52) U.S. Cl.
CPC ............ *B32B 37/0038* (2013.01); *B32B 5/02* (2013.01); *B32B 15/14* (2013.01); *B32B 15/20* (2013.01); *H05K 1/0366* (2013.01); *H05K 3/022* (2013.01); *B32B 38/08* (2013.01); *B32B 2260/021* (2013.01); *B32B 2260/046* (2013.01); *B32B 2262/0276* (2013.01); *B32B 2307/204* (2013.01); *B32B 2307/748* (2013.01); *B32B 2311/12* (2013.01); *B32B 2457/08* (2013.01); *H05K 2201/0141* (2013.01); *H05K 2201/029* (2013.01)

(58) Field of Classification Search
CPC ..................... B32B 2457/08; H05K 3/022
See application file for complete search history.

(56) References Cited

U.S. PATENT DOCUMENTS

| 3,793,716 A * | 2/1974 | Smith-Johannsen .. H05B 3/146 264/105 |
| 4,163,003 A * | 7/1979 | Paul, Jr. .................. D01F 11/14 523/202 |
| 4,456,657 A * | 6/1984 | Cassat ..................... B32B 15/20 428/458 |
| 4,833,204 A * | 5/1989 | Yusa ..................... H05K 1/0326 525/487 |
| 4,910,077 A * | 3/1990 | Benedikt ................. B32B 15/08 442/232 |
| 2006/0257622 A1* | 11/2006 | Shin ........................ B32B 27/02 428/137 |
| 2014/0060899 A1* | 3/2014 | Park ..................... H05K 1/0366 174/255 |
| 2014/0106147 A1 | 4/2014 | Lee et al. |
| 2014/0335341 A1* | 11/2014 | Park ........................ B32B 15/20 525/276 |
| 2015/0189747 A1* | 7/2015 | Zeng ....................... B32B 5/024 523/435 |
| 2019/0104612 A1* | 4/2019 | Amla ..................... B32B 15/14 |

FOREIGN PATENT DOCUMENTS

| CN | 1863433 A | 11/2006 |
| CN | 102922809 A | 2/2013 |
| CN | 103562440 A | 2/2014 |
| CN | 108219371 A | 6/2018 |
| CN | 109575516 A | 4/2019 |
| CN | 109661111 A | 4/2019 |
| CN | 110154464 A | 8/2019 |
| CN | 111002644 A | 4/2020 |

OTHER PUBLICATIONS

First Office Action for CN Application No. 201911322264.8 dated Feb. 2, 2021.

(Continued)

*Primary Examiner* — Scott W Dodds
(74) *Attorney, Agent, or Firm* — Billion & Armitage

(57) ABSTRACT

Disclosed is a preparation method for a copper clad laminate comprising: (1) dissolving a polymer in an organic solvent, heating and stirring to obtain a pre-impregnation liquid; (2) impregnating a liquid crystal polymer cloth in the pre-impregnation liquid, and drying to obtain a liquid crystal polymer impregnated cloth; and (3) laminating the liquid crystal polymer impregnated cloth and a copper foil to prepare the copper clad laminate, wherein the polymer in step (1) is at least one selected from the group consisting of fully aromatic polyesteramide, epoxy resin, and polyimide; and the liquid crystal polymer cloth in step (2) is prepared from a liquid crystal polymer having a melting point greater than 280° C., a dielectric constant less than 3.2, and a dielectric loss tangent angle less than 0.0025. The preparation method for the copper clad laminate has a simple preparation process and a low manufacturing cost.

16 Claims, No Drawings

(56) References Cited

OTHER PUBLICATIONS

First search report for CN Application No. 201911322264.8, dated Jan. 27, 2021.
International Search Report and Written Opinion for PCT/CN2020/094436, mailed Aug. 21, 2020.
Second Office Action for CN Application No. 201911322264.8 dated Jun. 6, 2021.

* cited by examiner

PREPARATION METHOD FOR COPPER CLAD LAMINATE HAVING LOW DIELECTRIC CONSTANT AND HIGH PEEL STRENGTH, COPPER CLAD LAMINATE AND APPLICATION THEREOF

CROSS-REFERENCE TO RELATED APPLICATION

This application is a National Stage Application of PCT/CN2020/094436, filed on Jun. 4, 2020, which claims benefit of application Ser. No. 20/191,1322264.8, filed on Dec. 20, 2019 in China and which applications are incorporated herein by reference. A claim of priority to all, to the extent appropriate, is made.

TECHNICAL FIELD

The present disclosure relates to the field of semiconductors, and more particularly, to a preparation method for a copper clad laminate having a low dielectric constant and a high peel strength, a copper clad laminate and an application thereof.

BACKGROUND

With the advent of 5G high-frequency communication era and the rapid development of miniaturization and high performance of various electronic components, a printed circuit board (PCB) used in these fields is also developing rapidly towards high density, high precision and high performance A substrate for preparing the PCB is a copper clad laminate (CCL), so that requirements on high heat resistance (such as resisting a temperature of 260° C.), excellent dielectric property, high mechanical property, flame retardance and other properties are put forward for the CCL.

A resin is needed during preparation of the copper clad laminate, and resins used in the prior art comprise polyphenylene oxide (PPO), polytetrafluoroethylene (PTFE), polyimide (PI), and a liquid crystal polymer (LCP). The copper clad laminate made of the polytetrafluoroethylene (PTFE) is a microwave circuit substrate with an excellent dielectric property which has been widely used, but the copper clad laminate has a poor mechanical property, and a low adhesion to a copper foil due to a low polarity of the polytetrafluoroethylene. Since having a linear expansion coefficient similar to that of copper, and a strong adhesion to the copper foil, the polyimide is usually used as a flexible printed circuit board. However, the polyimide has high toxicity, harsh molding conditions, high water absorption, and poor high-frequency dielectric property. The polyphenylene oxide has high mechanical strength, self-flame-retardance and dielectric property little affected by frequency, temperature and humidity. But the melting point of the polyphenylene oxide is only 268° C., which cannot meet a temperature resistance requirement of lead-free reflow soldering.

A preparation method for a copper clad laminate by using a liquid crystal polymer comprises: manufacturing a liquid crystal polyester film first, and then laminating the liquid crystal polyester film with the copper foil at a high temperature by a high-temperature roller press to obtain the copper clad laminate. However, this method is prone to problems of anisotropy of the copper clad laminate and film breakage during high-temperature lamination. Moreover, a requirement on the preparation of liquid crystal polyester film is very high, resulting in a high cost of the prepared copper clad laminate, so that the copper clad laminate cannot be massively applied in industry.

There is another preparation method for a copper clad laminate by using a liquid crystal polymer, which comprises: coating a liquid crystal polyester solution on a copper foil, and then laminating with the copper foil at a high temperature by the high-temperature roller press to obtain the copper clad laminate. However, a thermoplastic liquid crystal polyester is used for coating in this method, and there is a large residual stress during coating, resulting in size shrinkage and film breakage of the prepared copper clad laminate.

Therefore, it is necessary to provide a preparation method for a copper clad laminate, and the copper clad laminate prepared by the method has an excellent dielectric property, a good mechanical property, and a high temperature resistance.

SUMMARY

The present disclosure aims to solve at least one of above technical problems in the prior art. Therefore, the present disclosure provides a preparation method for a copper clad laminate having a low dielectric constant and a high peel strength. The copper clad laminate prepared by the method of the present disclosure has a low dielectric constant (Dk) and a low dielectric loss tangent angle (Df), thus having an excellent dielectric property. In addition, the prepared copper clad laminate has a good mechanical property and a high temperature resistance.

The present disclosure provides a preparation method for a copper clad laminate having a low dielectric constant and a high peel strength, which comprises the following steps of:
(1) dissolving a polymer in an organic solvent, heating and stirring to obtain a pre-impregnation liquid for later use;
(2) impregnating a liquid crystal polymer cloth in the pre-impregnation liquid obtained in step (1), and drying to obtain a liquid crystal polymer impregnated cloth for later use; and
(3) laminating the liquid crystal polymer impregnated cloth obtained in step (2) with a copper foil to obtain the copper clad laminate,
wherein the polymer in step (1) is at least one selected from the group consisting of fully aromatic polyesteramide, epoxy resin, and polyimide; and
the liquid crystal polymer cloth in step (2) is prepared from a liquid crystal polymer having a melting point greater than 280° C., a dielectric constant less than 3.2, and a dielectric loss tangent angle less than 0.0025.

In one or more embodiments, the liquid crystal polymer cloth in step (2) is prepared from a liquid crystal polymer having a melting point ranging from 280° C. to 400° C., a dielectric constant less than 3.0, and a dielectric loss tangent angle less than 0.002.

In one or more embodiments, the liquid crystal polymer cloth in step (2) is prepared from a liquid crystal polymer having a melting point ranging from 300° C. to 400° C., a dielectric constant less than 3.0, and a dielectric loss tangent angle less than 0.002.

In one or more embodiments, a weight ratio of the liquid crystal polymer to the organic solvent in step (1) is (4 to 12):(80 to 100), which is namely 4:100 to 12:80.

In one or more embodiments, the organic solvent in step (1) is an amide organic solvent.

In one or more embodiments, the amide organic solvent in step (1) is at least one selected from the group consisting of dimethylacetamide, N, N-dimethylformamide, benzamide, and succinimide In one or more embodiments, the amide organic solvent is dimethylacetamide and/or N, N-dimethylformamide In one or more embodiments, the heating and stirring in step (1) are carried out at a temperature ranging from 140° C. to 165° C.

In one or more embodiments, the heating and stirring in step (1) are carried out at a typical but non-limiting temperature, such as 140° C., 145° C., 150° C., 155° C., 160° C., or 165° C.

In one or more embodiments, the heating and stirring in step (1) are carried out at a speed ranging from 40 rpm to 200 rpm, and the stirring lasts for 20 minutes to 40 minutes.

In one or more embodiments, the heating and stirring in step (1) are carried out at a typical but non-limiting speed, such as 40 rpm, 60 rpm, 80 rpm, 100 rpm, 120 rpm, 140 rpm, 160 rpm, 180 rpm, or 200 rpm. In one or more embodiments, the heating and stirring in step (1) last for a typical but non-limiting time, such as 20 minutes, 25 minutes, 30 minutes, 35 minutes, or 40 minutes.

In one or more embodiments, the impregnating in step (2) lasts for 4 minutes to 10 minutes.

In one or more embodiments, the impregnating in step (2) lasts for a typical but non-limiting time, such as 4 minutes, 4.5 minutes, 5 minutes, 5.5 minutes, 6 minutes, 6.5 minutes, 7 minutes, 7.5 minutes, 8 minutes, 8.5 minutes, 9 minutes, 9.5 minutes, or 10 minutes.

In one or more embodiments, the drying process in step (2) comprises, under a vacuum degree of 1 Pa to 500 Pa, drying is conducted at a temperature of 90° C. to 100° C. for 5 minutes to 15 minutes, at a temperature of 100° C. to 120° C. for 5 minutes to 15 minutes, at a temperature of 120° C. to 140° C. for 5 minutes to 15 minutes, at a temperature of 140° C. to 170° C. for 15 minutes to 30 minutes, and at a temperature of 250° C. to 280° C. for 20 minutes to 40 minutes.

In one or more embodiments, in step (2), by repeating impregnating and drying, a mass ratio of the polymer in step (1) in the obtained liquid crystal polymer impregnated cloth is 15% to 30%. In one or more embodiments, in step (2), by repeating impregnating and drying, the mass ratio of the polymer in step (1) in the obtained liquid crystal polymer impregnated cloth is 15% to 20%.

In one or more embodiments, the liquid crystal polymer cloth in step (2) is prepared from a liquid crystal polymer having a melting point greater than 300° C. (such as 300° C. to 800° C.), a dielectric constant less than 3.0, and a dielectric loss tangent angle less than 0.002.

In one or more embodiments, an intrinsic viscosity of the liquid crystal polymer ranges from 4 dL/g to 10 dL/g. In one or more embodiments, the intrinsic viscosity of the liquid crystal polymer ranges from 5.5 dL/g to 7 dL/g.

In one or more embodiments, the liquid crystal polymer cloth in step (2) is prepared from a fully aromatic polyester fiber having a melting point greater than 300° C. (such as 300° C. to 800° C.), a dielectric constant less than 3.0, and a dielectric loss tangent angle less than 0.002.

In one or more embodiments, before the liquid crystal polymer cloth in step (2) is used, the liquid crystal polymer cloth is subjected to a pretreatment step comprising: mixing the organic solvent with a silane coupling agent, stirring at a stirring speed of 250 rpm to 350 rpm and a temperature of 10° C. to 30° C. for 5 minutes to 15 minutes to obtain a surface treatment solution; then impregnating the liquid crystal polymer cloth in the surface treatment solution for 3 minutes to 8 minutes; and taking out and drying the liquid crystal polymer cloth.

In one or more embodiments, a mass ratio of the organic solvent to the silane coupling agent is 100:(0.5 to 2), which is namely 100:0.5 to 100:2.

In one or more embodiments, the silane coupling agent is at least one selected from the group consisting of γ-(2,3-epoxypropoxy)propytrimethosysilane, vinyl silane, aminosilane, and methacryloyloxysilane. In one or more embodiments, the silane coupling agent is γ-(2,3-epoxypropoxy)propytrimethosysilane.

In one or more embodiments, the liquid crystal polymer cloth in step (2) is made by a method comprising: weaving a liquid crystal polymer into a liquid crystal polymer fiber first; and then weaving the liquid crystal polymer fiber into the liquid crystal polymer cloth.

In one or more embodiments, before the laminating in step (3), the mixed solution of the pre-impregnation liquid obtained in step (1) and the silane coupling agent is coated on the surface of the copper foil, and the mass ratio of the pre-impregnation liquid to the silane coupling agent is 100:(0.5 to 2), which is namely 100:0.5 to 100:2. Then, the mixture is dried. This process is beneficial for improving a bonding force between the copper foil and the liquid crystal polymer impregnated cloth.

In one or more embodiments, in step (3), one or more liquid crystal polymer impregnated cloths are stacked together, and then the stacked liquid crystal polymer impregnated cloths are clamped from upper and lower sides by two copper foils.

In one or more embodiments, the laminating in step (3) is carried out at a pressure ranging from 15 atm to 22 atm (atmospheric pressure), at a temperature ranging from 300° C. to 350° C., and the laminating lasts from 10 minutes to 20 minutes. Heating to 300° C. to 350° C. at a speed of 10° C./min to 15° C./min is realized during lamination. The present disclosure further provides a copper clad laminate having a low dielectric constant and a high peel strength, and the copper clad laminate is prepared by the preparation method above.

The copper clad laminate of the present disclosure is applied in the field of semiconductors.

The present disclosure further provides use of the copper clad laminate having the low dielectric constant and the high peel strength in the field of semiconductors.

The present disclosure further provides a circuit board (such as a flexible printed circuit board, FPC), comprising the copper clad laminate of the present disclosure.

Compared with the prior art, the present disclosure has the following beneficial effects.

(1) The preparation process of the copper clad laminate of the present disclosure is simple, which mainly comprises impregnating the liquid crystal polymer cloth with specific performance parameters by using the pre-impregnation liquid prepared from the proper polymer. The prepared copper clad laminate has a dielectric constant not greater than 3, a dielectric loss tangent angle not greater than 0.0018, a peel strength not less than 1.50 N/mm, and a high temperature resistance of 290° C.

(2) The preparation method for the copper clad laminate of the present disclosure mainly comprises three steps, with a simple preparation process and a low manufacturing cost, thus being suitable for industrial mass production.

DETAILED DESCRIPTION

In order to make those skilled in the art better understand the technical solutions of the present disclosure, the following embodiments are now provided for description. It should be understood that the following embodiments do not limit the scope of protection claimed by the present disclosure. If the specific conditions are not indicated in the embodiments, the conventional conditions or the conditions suggested by the manufacturer should be followed. If the manufacturer of the reagent or the instrument used is not indicated, the reagent or the instrument is regarded as a commercially available conventional product.

Embodiment 1

Preparation of Liquid Crystal Polymer (A1)

1,030 g of 4-hydroxybenzoic acid, 472 g of 6-hydroxy-2-naphthoic acid, 1,125 g of acetic anhydride, and 202.0 g of acetic acid were added into a reactor equipped with a stainless steel C-type stirrer, a torque meter, a nitrogen conduit, a thermometer, a pressure meter and a reflux condenser. The reactor was purified by vacuumizing and flushing with dry nitrogen, then 0.35 g of 1-methylimidazole was added, stirred at a speed of 160 rpm under the protection of nitrogen, heated to 150° C. within 40 minutes, and refluxed at the temperature for 40 minutes. After 14.0 g of phenol were added into the reactor, the reactor was heated to 340° C. within 110 minutes. During this period, the by-product acetic acid was removed by distillation. After keeping at a constant temperature of 340° C. for 40 minutes, the pressure was gradually reduced to about 100 Pa within 15 minutes and a vacuum condition was kept until the torque was increased by more than 35%. After finishing the reaction, a prepolymer was taken out, and cooled to room temperature, and then crushed by a crusher. Solid-phase polymerization was carried out on the crushed prepolymer by the following method comprising: under a negative pressure of 200 Pa, heating the crushed prepolymer from room temperature to 230° C. within 2.5 hours, then heating the crushed prepolymer from 230° C. to 270° C. within 2.5 hours, and keeping the temperature at 270° C. for 9 hours to obtain the liquid crystal polymer (A1).

After testing, it was found that the liquid crystal polymer (A1) had a melting point of 300° C., an intrinsic viscosity of 5.5 dL/g, a dielectric constant (Dk) of 2.9, and a dielectric loss tangent angle (Df) of 0.0012.

Embodiment 2

Preparation of Liquid Crystal Polymer (A2)

951 g of 2-hydroxy-6-naphthoic acid, 283 g of 4-aminophenol, 425.39 g of isophthalic acid, and 1133 g of acetic anhydride were added into a reactor equipped with a stirring device (stainless steel C-type stirrer), a torque meter, a nitrogen conduit, a thermometer, and a reflux condenser. After full replacement with nitrogen inside the reactor, the temperature in the reactor was increased to 155° C. within 18 minutes under an action of a nitrogen flow, the liquid in the reactor refluxed for 3.5 hours under this temperature, and then the temperature was increased to 325° C. within 180 minutes. Meanwhile, the by-product acetic acid and unreacted acetic anhydride were removed by distillation. When it was confirmed that the torque was increased, the reaction could be regarded as being terminated, and the reactant was taken out. The reactant was crushed into powder and insulated at 250° C. for 3 hours in a nitrogen atmosphere to obtain a liquid crystal polymer, which was namely the liquid crystal polymer (A2).

After testing, it was found that the liquid crystal polymer (A2) had a melting point of 300° C., a dielectric constant (Dk) of 3.0, and a dielectric loss tangent angle (Df) of 0.0022.

Embodiment 3

Preparation of Liquid Crystal Polymer Cloth (B1)

The liquid crystal polymer (A1) prepared in Embodiment 1 was dried in a vacuum dryer at 160° C. for 10 hours, melt-extruded by a double-screw extruder after a moisture content was lower than 20 ppm, and metered by a gear pump. The liquid crystal polymer (A1) was supplied to a spinning package. In this case, a spinning temperature from an outlet of the extruder to the spinning package was 320° C. A filtering mesh of a filter was 350 meshes, the liquid crystal polymer (A1) was sprayed at a spraying rate of 20 cc/min by a spinning nozzle having 58 orifices with an aperture of 0.15 mm, and 58 monofilaments were wound on an aluminum alloy winding drum (with a thermal expansion coefficient of $2.5*10^{-5}$) at a speed of 800 m/min at the same time, and then, under a negative pressure of 150 Pa, heated from room temperature to 250° C. within 5 hours, then heated from 250° C. to 270° C. within 2.5 hours, and insulated at 270° C. for 15 hours for heat treatment. After heat treatment, the monofilaments were stretched at a speed of 400 m/min according to a stretching ratio of 1:1.2 (a stretching ratio of a transverse direction to a longitudinal direction of a film), and rewound from the heat treatment winding drum to a paper tube at 265° C. to obtain a fiber (F1). After testing, it was found that the fiber had a diameter of 10 μm, a strength of 58 cN/dtex, an elongation percentage of 1.90%, and a modulus of elasticity of 955 cN/dtex.

Two pieces of fibers (F1) were doubled, twisted and warped in sequence to form warped yarns, and the warped yarns were vertically interwoven with weft yarns to form the liquid crystal polymer cloth (B1). The liquid crystal polymer cloth (B1) had a thickness of 32 μm.

Embodiment 4

Preparation of Liquid Crystal Polymer Cloth (B2)

Compared with Embodiment 3, the liquid crystal polymer (A2) prepared in Embodiment 2 was used in this Embodiment instead of the liquid crystal polymer (A1) prepared in Embodiment 1 to prepare a fiber (F2), and other procedures were the same as those in Embodiment 3.

In addition, five pieces of fibers (F2) were doubled, twisted and warped in sequence to form warped yarns, and the warped yarns were vertically interwoven with weft yarns to form the liquid crystal polymer cloth (B2). The liquid crystal polymer cloth (B2) had a thickness of 82 μm.

Embodiment 5

A preparation method for a copper clad laminate having a low dielectric constant and a high peel strength, which comprised the following steps.
(1) Calculated in parts by weight, 8 parts of the liquid crystal polymer (A2) obtained in Embodiment 2 were dissolved in 92 parts of dimethylacetamide, heated to 160° C., and stirred at a stirring speed of 100 rpm for 30 minutes to obtain a pre-impregnation liquid for later use.
(2) N, N-dimethylformamide and γ-(2,3-epoxypropoxy) propyltrimethosysilane were mixed according to the mass ratio of 100:1.5, and then stirred at a stirring speed of 300 rpm at 20° C. for 10 minutes to obtain a surface treatment solution. Then, the liquid crystal polymer cloth (B1) obtained in Embodiment 3 was impregnated in the surface treatment solution for 5 minutes, and then the liquid crystal polymer cloth was taken out, and dried at 50° C. for 10 minutes, dried at 100° C. for 10 minutes, and dried at 160° C. for 30 minutes in sequence to obtain the treated liquid crystal polymer cloth (B1). The treated liquid crystal polymer cloth (B1) was impregnated in the pre-impregnation liquid obtained in step (1) for 5 minutes, and then, under a vacuum degree of 100 Pa, dried at 95° C. for 10 minutes, dried at 110° C. for 10 minutes, dried at 130° C. for 10 minutes, dried at 160° C. for 20 minutes, and dried at 250° C. for 30 minutes in sequence to obtain a liquid crystal polymer impregnated cloth for later use, wherein the mass ratio of the liquid crystal polymer (A2) in step (1) in the obtained liquid crystal polymer impregnated cloth was 20%.

(3) The mixed solution of the pre-impregnation liquid obtained in step (1) and a silane coupling agent was coated on the surface of a copper foil, and then dried, wherein the mass ratio of the pre-impregnation liquid to the silane coupling agent was 100:1. The liquid crystal polymer impregnated cloth obtained in step (2) was laminated with two copper foils at a pressure of 20 atm (atmospheric pressure) and a temperature of 300° C. for 15 minutes to obtain the copper clad laminate.

After testing, it was found that the prepared copper clad laminate had a dielectric constant of 2.9, a dielectric loss tangent angle of 0.0015, and a peel strength of 1.58 N/mm, and resisted a high temperature of 290° C. for more than 120 seconds. Moreover, the flame retardance of the copper clad laminate could reach V-0, wherein V-2 indicates that after performing a burning test on a sample for 10 seconds twice, the flame is extinguished within 60 seconds, with a burning material falling off; V-1 indicates that after performing a burning test on a sample for 10 seconds twice, the flame is extinguished within 60 seconds, without the burning material falling off; and V-0 indicates that after performing a burning test on a sample for 10 seconds twice, the flame is extinguished within 30 seconds, without the burning material falling off.

Test conditions of the dielectric constant (Dk) and the dielectric loss tangent angle (Df) were as follows: an instrument Agilent N5230A and a fixture SPDR were used, and the measurement frequency was 10 GHz.

Testing conditions of the peel strength were as follows: the testing was carried out according to the method of IPC-TM-650 2.4.9, and the peel strength of the copper foil layer at 90 degrees was tested. The recorded data was a value of the smaller peel strength in both sides of the double-sided laminate.

Embodiment 6

A preparation method for a copper clad laminate having a low dielectric constant and a high peel strength, which comprised the following steps.

(1) The epoxy resin was dissolved in dimethylacetamide according to the mass ratio of 5:85, heated to 150° C., and stirred at a stirring speed of 100 rpm for 40 minutes to obtain a pre-impregnation liquid for later use.

(2) The liquid crystal polymer cloth (B2) obtained in Embodiment 4 was impregnated in the pre-impregnation liquid obtained in step (1) for 8 minutes, and then dried. The drying process comprised: under a vacuum degree of 150 Pa, drying was conducted at 90° C. for 15 minutes, at 100° C. for 15 minutes, at 140° C. for 5 minutes, at 170° C. for 15 minutes, and at 280° C. for 20 minutes in sequence to obtain a liquid crystal polymer impregnated cloth for later use, wherein the mass ratio of the epoxy resin in step (1) in the liquid crystal polymer impregnated cloth was 15%.

(3) The liquid crystal polymer impregnated cloth obtained in step (2) was laminated with a copper foil at a pressure of 15 atm (atmospheric pressure) and a temperature of 300° C. for 20 minutes to obtain the copper clad laminate.

After testing, it was found that the prepared copper clad laminate had a dielectric constant of 3.0, a dielectric loss tangent angle of 0.0017, and a peel strength of 1.50 N/mm, and resisted a high temperature of 290° C. for more than 120 seconds. Moreover, the flame retardance of the copper clad laminate was V-0.

Test conditions of the Dk and the Df were as follows: an instrument Agilent N5230A and a fixture SPDR were used, and the measurement frequency was 10 GHz.

Testing conditions of the peel strength were as follows: the testing was carried out according to the method of IPC-TM-650 2.4.9, and the peel strength of the copper foil layer at 90 degrees was tested. The recorded data was a value of the smaller peel strength in both sides of the double-sided laminate.

Embodiment 7

Compared with Embodiment 6, Example 7 is substantially the same as Example 6, except that: polyimide was used in step (1) of Embodiment 7 instead of the epoxy resin; before the laminating in step (3), the mixed solution of the pre-impregnation liquid obtained in step (1) and the silane coupling agent was coated on the surface of the copper foil, wherein the mass ratio of the pre-impregnation liquid to the silane coupling agent was 100:1.5, and then the mixture was dried. Other procedures were the same as those in Embodiment 6.

The prepared copper clad laminate had a dielectric constant of 3.0, a dielectric loss tangent angle of 0.0016, and a peel strength of 1.57 N/mm, and resisted a high temperature of 290° C. for more than 120 seconds. Moreover, the flame retardance of the copper clad laminate could reach V-0.

Comparative Embodiment 1

Compared with Embodiment 5, polyvinyl chloride resin was used in step (1) of Comparative Example 1 instead of the liquid crystal polymer (A2), and other procedures were the same as those in Embodiment 5.

The prepared copper clad laminate had a dielectric constant of 3.6, a dielectric loss tangent angle of 0.0038, and a peel strength of 1.41 N/mm, and resisted a high temperature of 290° C. for more than 60 seconds. Moreover, the flame retardance of the copper clad laminate was V-1.

Application Example

A circuit board, comprised the copper clad laminate prepared in Embodiment 5.

A flexible printed circuit board (FPC), comprised the copper clad laminate prepared in Embodiment 5.

INDUSTRIAL APPLICABILITY (1) The preparation process of the copper clad laminate of the present disclosure is simple, which mainly comprises impregnating the liquid crystal polymer cloth with specific performance parameters by using the pre-impregnation liquid prepared from the proper polymer. The prepared copper

The invention claimed is:

1. A preparation method for a copper clad laminate, comprising:
   (1) dissolving a polymer in an organic solvent, heating and stirring to obtain a pre-impregnation liquid for later use;
   (2) impregnating a liquid crystal polymer cloth in the pre-impregnation liquid obtained in step (1), and drying to obtain a liquid crystal polymer impregnated cloth for later use; and
   (3) laminating the liquid crystal polymer impregnated cloth obtained in step (2) with a copper foil to obtain the copper clad laminate;
   wherein the polymer in step (1) is at least one selected from the group consisting of fully aromatic polyesteramide, epoxy resin, and polyimide;
   the liquid crystal polymer cloth in step (2) is prepared from a liquid crystal polymer having a melting point greater than 280° C., a dielectric constant less than 3.2, and a dielectric loss tangent angle less than 0.0025; and
   a drying process in step (2) comprises: under a vacuum degree of 1 Pa to 500 Pa, drying is conducted at a temperature of 90° C. to 100° C. for 5 minutes to 15 minutes, at a temperature of 100° C. to 120° C. for 5 minutes to 15 minutes, at a temperature of 120° C. to 140° C. for 5 minutes to 15 minutes, at a temperature of 140° C. to 170° C. for 15 minutes to 30 minutes, and at a temperature of 250° C. to 280° C. for 20 minutes to 40 minutes.

2. The preparation method according to claim 1, wherein a weight ratio of the polymer to the organic solvent in step (1) is 1:25 to 3:20.

3. The preparation method according to claim 1, wherein the organic solvent in step (1) is an amide organic solvent.

4. The preparation method according to claim 3, wherein the amide organic solvent in step (1) is at least one selected from the group consisting of dimethylacetamide, N, N-dimethylformamide, benzamide, and succinimide.

5. The preparation method according to claim 4, wherein the amide organic solvent is dimethylacetamide and/or N, N-dimethylformamide.

6. The preparation method according to claim 1, wherein the heating and stirring in step (1) are carried out at a temperature ranging from 140° C. to 165° C.

7. The preparation method according to claim 1, wherein the heating and stirring in step (1) are carried out at a speed ranging from 40 rpm to 200 rpm, and the stirring lasts for 20 minutes to 40 minutes.

8. The preparation method according to claim 1, wherein the liquid crystal polymer cloth in step (2) is prepared from a liquid crystal polymer having a melting point ranging from 280° C. to 400° C., a dielectric constant less than 3.0, and a dielectric loss tangent angle less than 0.002.

9. The preparation method according to claim 8, wherein the liquid crystal polymer cloth in step (2) is prepared from a liquid crystal polymer having a melting point ranging from 300° C. to 400° C., a dielectric constant less than 3.0, and a dielectric loss tangent angle less than 0.002.

10. The preparation method according to claim 1, wherein the impregnating in step (2) lasts for 4 minutes to 10 minutes.

11. The preparation method according to claim 1, wherein a mass percent of the polymer in step (1) in the liquid crystal polymer impregnated cloth in step (2) is 15% to 30%.

12. The preparation method according to claim 1, wherein a mass percent of the polymer in step (1) in the liquid crystal polymer impregnated cloth in step (2) is 15% to 20%.

13. The preparation method according to claim 1, wherein before the liquid crystal polymer cloth in step (2) is used, the liquid crystal polymer cloth is subjected a pretreatment step comprising: mixing the organic solvent with a silane coupling agent according to a mass ratio of 200:1 to 50:1; stirring at a stirring speed of 250 rpm to 350 rpm to obtain a surface treatment solution; impregnating the liquid crystal polymer cloth in the surface treatment solution; and taking out and drying the liquid crystal polymer cloth.

14. The preparation method according to claim 13, wherein the silane coupling agent is at least one selected from the group consisting of γ-(2,3-epoxypropoxy) propytrimethosysilane, vinyl silane, aminosilane, and methacryloyloxysilane.

15. The preparation method according to claim 13, wherein before the laminating in step (3), a mixed solution of the pre-impregnation liquid obtained in step (1) and the silane coupling agent is coated on a surface of the copper foil, and a mass ratio of the pre-impregnation liquid to the silane coupling agent is 200:1 to 50:1.

16. The preparation method according to claim 1, wherein the laminating in step (3) is carried out at a pressure ranging from 15 atm to 22 atm, at a temperature ranging from 300° C. to 350° C., and the laminating lasts from 10 minutes to 20 minutes.

* * * * *